(12) United States Patent
Cheng

(10) Patent No.: US 7,888,174 B2
(45) Date of Patent: Feb. 15, 2011

(54) EMBEDDED CHIP PACKAGE PROCESS

(75) Inventor: David C. H. Cheng, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 20 days.

(21) Appl. No.: 12/234,702

(22) Filed: Sep. 21, 2008

(65) Prior Publication Data

US 2009/0023246 A1 Jan. 22, 2009

Related U.S. Application Data

(62) Division of application No. 11/467,168, filed on Aug. 25, 2006, now Pat. No. 7,663,249.

(30) Foreign Application Priority Data

Jun. 20, 2006 (TW) .............................. 95122007 A

(51) Int. Cl.
*H01L 21/00* (2006.01)
*H01L 21/44* (2006.01)
*H01L 21/4763* (2006.01)

(52) U.S. Cl. ..................... 438/108; 438/109; 438/127; 438/613; 438/637; 438/667; 257/E21.503; 257/E21.614

(58) Field of Classification Search ................ 438/108, 438/109, 124, 613, 637, 667; 257/E21.503; 257/E21.614

See application file for complete search history.

(56) References Cited

U.S. PATENT DOCUMENTS

| 6,489,685 | B2 * | 12/2002 | Asahi et al. | 257/774 |
|---|---|---|---|---|
| 6,780,668 | B1 * | 8/2004 | Tsukahara et al. | 438/106 |
| 6,784,530 | B2 * | 8/2004 | Sugaya et al. | 257/686 |
| 7,569,925 | B2 * | 8/2009 | Nishizawa et al. | 257/700 |
| 7,615,856 | B2 * | 11/2009 | Sakai et al. | 257/686 |
| 2005/0233504 | A1 * | 10/2005 | Doi et al. | 438/127 |

* cited by examiner

*Primary Examiner*—Walter L Lindsay, Jr.
*Assistant Examiner*—Ron Pompey
(74) *Attorney, Agent, or Firm*—Jianq Chyun IP Office

(57) ABSTRACT

An embedded chip package process is disclosed. First, a first substrate having a first patterned circuit layer thereon is provided. Then, a first chip is disposed on the first patterned circuit layer and electrically connected to the first patterned circuit layer. A second substrate having a second patterned circuit layer thereon is provided. A second chip is disposed on the second patterned circuit layer and electrically connected to the second patterned circuit layer. Afterwards, a dielectric material layer is formed and covers the first chip and the first patterned circuit layer. Then, a compression process is performed to cover the second substrate over the dielectric material layer so that the second patterned circuit layer and the second chip on the second substrate are embedded into the dielectric material layer.

12 Claims, 4 Drawing Sheets

EMBEDDED CHIP PACKAGE PROCESS

CROSS-REFERENCE TO RELATED APPLICATION

This application is a divisional of an application Ser. No. 11/467,168, filed on Aug. 25, 2006, now pending, which claims the priority benefit of Taiwan application serial no. 95122007, filed on Jun. 20, 2006. The entirety of each of the above-mentioned patent applications is hereby incorporated by reference herein and made a part of this specification.

BACKGROUND OF THE INVENTION

1. Field of the Invention

The present invention relates to a chip package structure and fabricating method thereof, and more particularly, to an embedded chip package structure and fabricating method thereof.

2. Description of Related Art

With continuous innovation in electronic technologies in recent years, more personalized and functionally improved hi-tech electronic products continue to appear in the market. Moreover, the upcoming trend in design is to produce lighter and more compact products. In general, a circuit substrate is disposed inside these electronic products. The circuit substrate carries a single chip or multiple chips to serve as the data processing unit of the electronic product. However, disposing one or more chips on the circuit substrate often increases the carrying surface area. Therefore, embedding the chips inside the circuit substrate has become a critical technique at the moment.

FIG. 1 is a schematic cross-sectional view of a conventional embedded chip package structure. As shown in FIG. 1, the embedded chip package structure 30 includes a substrate 300, a plurality of chips 310, a dielectric layer 330, an oxidation-resistant layer 360 and a solder mask layer 370. The chips 310 are disposed on the substrate 300, and the dielectric layer 330 is formed over the substrate 300 to cover the chips 310. In addition, the bonding pad 320 of each of the chips 310 is electrically connected to a conductive hole 340, and the conductive hole 340 is electrically connected to a corresponding conductive plug 350 to form an embedded chip package structure 30.

In the foregoing embedded chip package structure 30, the chips 310 are arranged to be disposed on the same plane. To increase the number of chips 310 in the package structure 30, the area of the substrate 300 must be increased correspondingly. With this constraint, if the performance of the embedded chip package structure needs to improve, the volume of the embedded chip package structure must be increased to accommodate more chips. However, this is not a good option considering the current trend of product streamlining and miniaturization. Conversely, if the embedded chip package structure is miniaturized to meet the current trend, the number of chips that can be packed inside the structure is reduced so that the performance of the embedded chip package structure is lowered.

SUMMARY OF THE INVENTION

Accordingly, at least one objective of the present invention is to provide an embedded chip package structure and fabricating process thereof capable of accommodating more chips without increasing the volume of the embedded chip package.

To achieve this and other advantages and in accordance with the purpose of the invention, as embodied and broadly described herein, the invention provides an embedded chip package process. First, a first substrate having a first patterned circuit layer thereon is provided. The first patterned circuit layer has at least a first bonding pad. A first chip is disposed on the bonding pad and electrically connected to the first patterned circuit layer. Then, a second substrate having a second patterned circuit layer thereon is provided. The second patterned circuit layer has at least a second bonding pad. A second chip is disposed on the second bonding pad and electrically connected to the second patterned circuit layer. Afterwards, a dielectric material layer covers the first patterned circuit layer and the first chip. Then, a compression process is performed to cover the second substrate on the dielectric material layer. Furthermore, the second patterned circuit layer and the second chip on the second substrate are embedded into the dielectric material layer.

In one embodiment of the present invention, the step of disposing the foregoing first chip on the first patterned circuit layer and disposing the second chip on the second patterned circuit layer includes a flip-chip bonding process.

In one embodiment of the present invention, the foregoing dielectric material layer includes a plastic film formed by plasticizing a prepreg resin material.

In one embodiment of the present invention, after the step of performing the compression process, a curing process is further performed to cure the dielectric material layer.

In one embodiment of the present invention, after the step of performing the curing process, the first substrate and the second substrate are removed.

In one embodiment of the present invention, after removing the first substrate and the second substrate, at least a conductive through hole through the dielectric material layer is formed so that the first patterned circuit layer is electrically connected to the second patterned circuit layer.

In one embodiment of the present invention, a first contact is disposed at one end of the conductive through hole that corresponds to the first patterned circuit layer, and a second contact is disposed at the other end of the conductive through hole that corresponds to the second patterned circuit layer. Furthermore, the first contact is electrically connected to the second contact through the conductive through hole.

The present invention also provides another embedded chip package structure. The embedded chip package structure includes a dielectric material layer, a first patterned circuit layer, a first chip, a second patterned circuit layer and a second chip. The first patterned circuit layer is embedded within one side of the dielectric material layer and includes at least a first bonding pad and at least a first contact. The first chip is embedded in the dielectric material layer and electrically connected to the first bonding pad. The second patterned circuit layer is embedded within another side of the dielectric material layer and includes at least a second bonding pad and at least a second contact. The second chip is embedded in the dielectric material layer and electrically connected to the second bonding pad. Furthermore, the dielectric material layer has at least a conductive through hole electrically connected to the first contact and the second contact respectively.

In one embodiment of the present invention, the method of electrically connecting the first chip to the first patterned circuit layer and the second chip to the second patterned circuit layer includes a flip-chip bonding process.

In one embodiment of the present invention, the material constituting the dielectric material layer includes glass epoxy based resin (FR-4, FR-5), bismaleimide-triazine (BT) or epoxy resin.

In the present invention, the chips are disposed inside the embedded chip package structure by stacking. Hence, compared with the conventional method, more chips can be enclosed inside the same substrate area so that the size of the embedded chip package structure can be reduced while accommodating a larger number of chips. Consequently, the performance of the embedded chip package structure is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
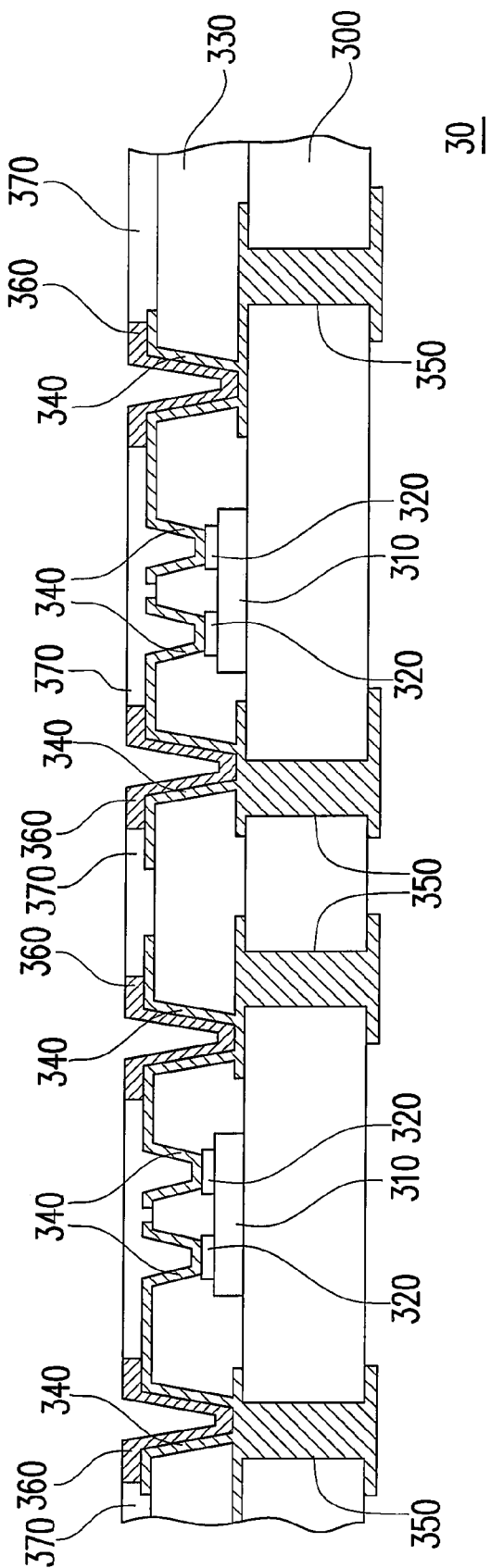
FIG. 1 is a schematic cross-sectional view of a conventional embedded chip package structure.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
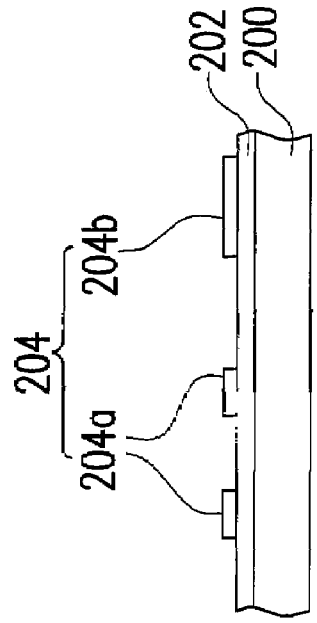
FIGS. 2A through 2E are schematic cross-sectional views showing the steps in an embedded chip package process according to one embodiment of the present invention.

FIGS. 2A through 2E are schematic cross-sectional views showing the steps in an embedded chip package process according to one embodiment of the present invention. As shown in FIG. 2A, a first substrate 100 and a second substrate 200 are provided. The first substrate 100 has a first adhesion layer 102 and a first patterned circuit layer 104 thereon, and the second substrate 200 has a second adhesion layer 202 and a second patterned circuit layer 204 thereon. The first patterned circuit layer 104 is disposed on the first adhesion layer 102 and has a plurality of bonding pads 104a and at least a first contact 104b. The second patterned circuit layer 204 is disposed on the second adhesion layer 202 and similarly has a plurality of bonding pads 204a and at least a second contact 204b.

In the present embodiment, a resin coated copper foil can be pre-fabricated on the first and the second substrates 100 and 200. The resin coated copper film comprises a copper film layer and an adhesion layer, and the copper film layer is attached to the first substrate 100 and the second substrate 200 through the adhesion layer by performing a compression process. Afterwards, a patterning process is performed to form the first patterned circuit layer 104 and the second patterned circuit layer 204 respectively.

Figure 2B:
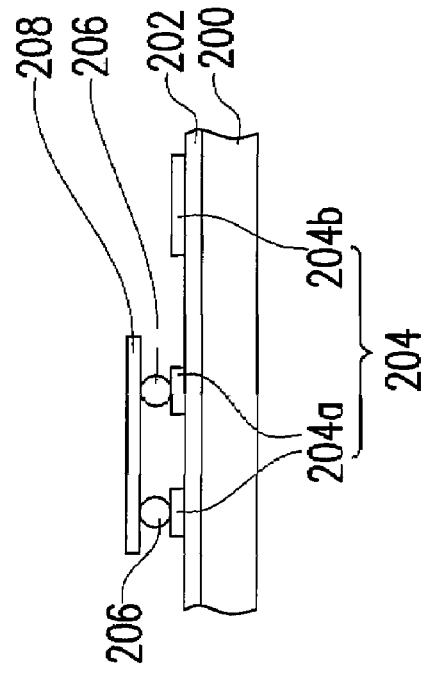

As shown in FIG. 2B, a first chip 108 having a plurality of bumps 106 thereon is disposed on the first substrate 100. The bumps 106 are electrically connected to their corresponding bonding pads 104a on the first patterned circuit layer 104 so that the first chip 108 is electrically connected to the first patterned circuit layer 104. Similarly, a second chip 208 having a plurality of bumps 206 thereon is disposed on the second substrate 200. The bumps 206 are electrically connected to their corresponding bonding pads 204a on the second patterned circuit layer 204 so that the second chip 208 is electrically connected to the second patterned circuit layer 204.

In the present embodiment, the flip-chip (F/C) bonding process is used to connect to the surface of the first substrate 100. The flip-chip bonding process includes steps such as bump fabrication, wafer cutting, die bonding, re-soldering, under-filling and curing, whose detailed descriptions are omitted. Similarly, an identical process is used to dispose the second chip 208 on the second substrate 200.

Figure 2C:
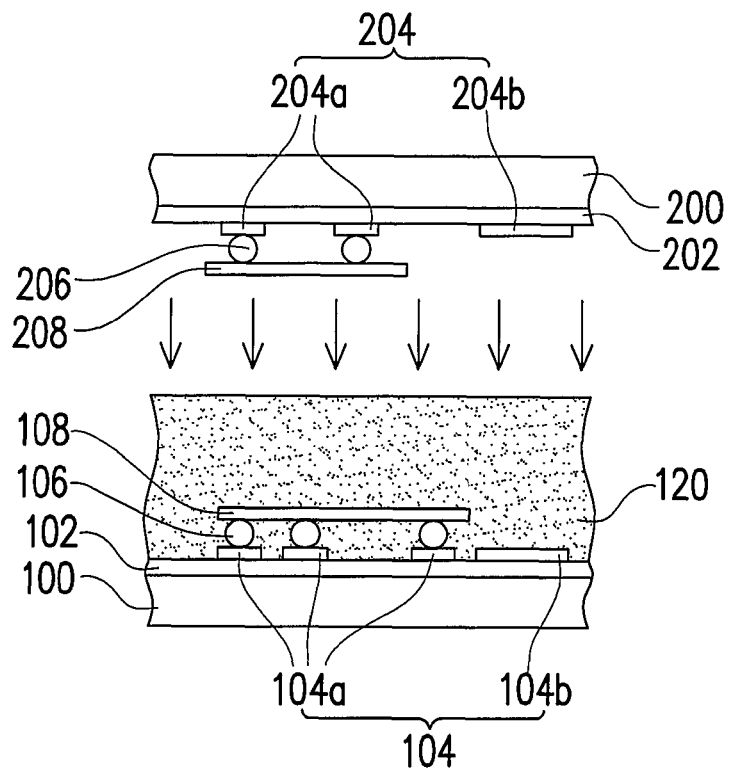
Figure 2D:
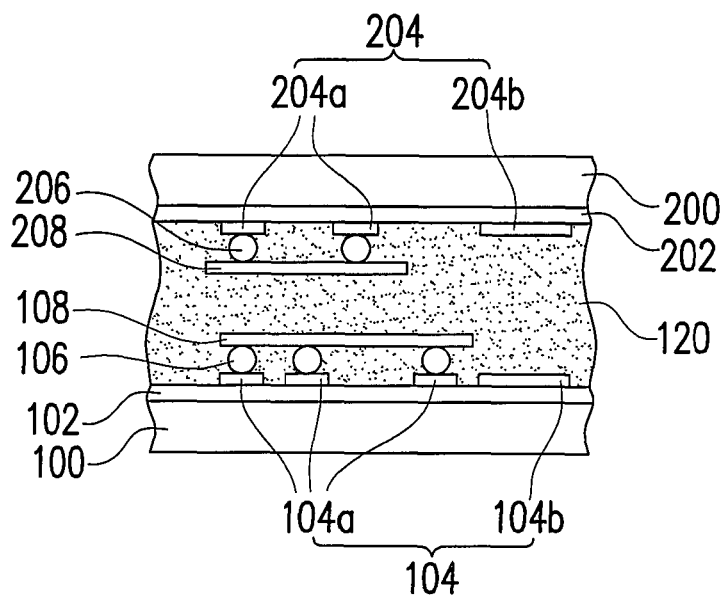

As shown in FIGS. 2C and 2D, a compression process is performed as shown in FIG. 2C. First, a dielectric material layer 120 is formed on the first patterned circuit layer 104 and the first chip 108. Then, the second substrate 200 covers the dielectric material layer 120 and a compression is performed so that the second patterned circuit layer 204 and the second chip 208 are embedded into the dielectric material layer 120. After performing the foregoing compression process, the dielectric material layer 120 fills up the space between the first patterned circuit layer 104 and the second patterned circuit layer 204 as shown in FIG. 2D.

In the present embodiment, the method of forming the dielectric material layer 120 on the surface of the first substrate 100 includes performing a polymerization on B-stage prepreg resin material and reaching a desired degree of plasticity to form a plastic film. A dielectric material 400 in B-stage can have a certain degree of compressibility and can adhere to the surface of a first chip carrier 110.

After performing the foregoing compression process, the present embodiment further includes performing a curing process to convert the dielectric material layer 120 in the prepreg state into a complete solid. In the present embodiment, the curing process includes heating the package structure shown in FIG. 2D in a thermal curing process. In other embodiments, according to the substrate material and process requirements, other curing methods such as the light curing process using ultraviolet light can be used.

In the aforementioned curing process, a polymerization of the molecules within the dielectric material layer 120 is utilized. When the dielectric material layer 120 is illuminated or heated, the molecules in the dielectric material are able to obtain sufficient energy to polymerize and cross-link with one another, thereby forming a solid dielectric material layer 120.

Figure 2E:
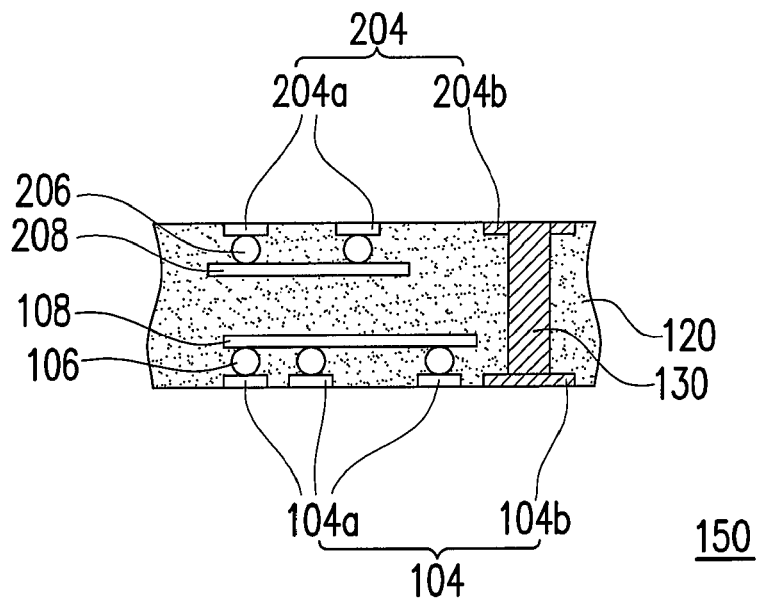

As shown in FIG. 2E, after forming the package structure shown in FIG. 2D, subsequent processes including performing a lift-off process to remove the first substrate 100, the first adhesion layer 102, the second substrate 200 and the second adhesion layer 202 may be performed. A Laser-drilling process is performed to drill a hole through the first contact 104b and the dielectric material layer 120, and then conductive material is deposited into the hole to form a conductive through hole 130 between the first contact 104b and the second contact 204b. The conductive through hole 130 electrically connects the first patterned circuit layer 104 and the second patterned circuit layer 204 together to form an embedded chip package structure 150. Afterwards, a lamination or build-up process can be used to connect the embedded chip package structure 150 to other circuits and form a complete product.

Figure 3:
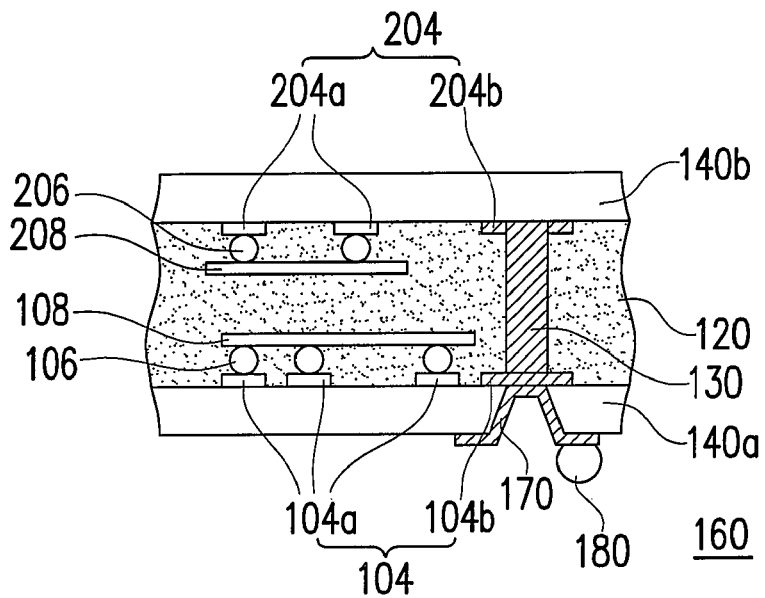
FIG. 3 is a schematic cross-sectional view of an embedded chip package circuit board according to another embodiment of the present invention.

FIG. 3 is a schematic cross-sectional view of an embedded chip package circuit board according to another embodiment of the present invention. As shown in FIG. 3, additional processes on the embedded chip package structure 150 in FIG. 2E are performed to form the embedded chip package circuit board 160. Hence, the elements and relationships in the embedded chip package circuit board 160 of the present embodiment identical to the previous embodiment are not described.

One major difference of the present embodiment from the previous embodiment is that, after performing the compression process and the curing process, removing the substrate and forming the conductive through hole 130, a first dielectric layer 140a and a second dielectric layer 140b are formed on the side of the first patterned circuit layer 104 and the second patterned circuit layer 204 respectively. Then, a conductive hole 170 is formed through the first dielectric layer 140a and connected to the first contact 104b and a solder ball 180 is implanted thereon.

According to the embedded chip package circuit board 160 in the present embodiment, the first chip 108 is electrically connected to the second chip 208 through the conductive through hole 130, and the conductive through hole 130 is electrically connected to other circuit system through the conductive hole 170 and the solder ball 180. Therefore, compared with a conventional embedded chip package structure 30, the number of conductive holes is substantially reduced and the processing steps are simplified.

In the present embodiment, the first substrate and the second substrate (both not shown) can be printed circuit substrates (PCS). However, in other embodiments, the substrates can be constructed using glass, insulating material and metallic material. In the present embodiment, the material constituting the bumps 106 and the solder balls 180 includes lead-tin alloy, but can be nickel-gold alloy or gold in other embodiments. In addition, the material constituting the dielectric material layer 120 in the present embodiment includes, for example, glass epoxy based resin (FR-4, FR-5), bismaleimide-triazine (BT) or epoxy resin.

The method of fabricating the embedded chip package structure in the present invention utilizes a stacking method to stack chips between two chip carriers in a compression process so that more chips can be enclosed inside the embedded chip package. In addition, compared with the conventional method, the embedded chip package structure in the present invention can enclose more chips within the same substrate area. Hence, the embedded chip package structure in the present invention can have a better performance. In addition, when the embedded chip package is turned into an embedded chip package circuit board by performing additional steps, electrical connection with a conductive through hole can be made through the design of the patterned circuit layer. As a result, the number of conductive holes required for electrical connection is reduced and the processing steps are simplified.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An embedded chip package process, comprising:
providing a first substrate, wherein the first substrate has a first patterned circuit layer thereon and the first patterned circuit layer has at least a first bonding pad, and a first chip is disposed on the first bonding pad and electrically connected to the first patterned circuit layer by performing a flip-chip bonding process;
providing a second substrate, wherein the second substrate has a second patterned circuit layer thereon and the second patterned circuit layer has at least a second bonding pad,;
covering a dielectric material layer over the first patterned circuit layer and the first chip;
performing a compression process to cover the second substrate over the dielectric material layer and embed the second patterned circuit layer of the second substrate into the dielectric material layer;
performing a curing process to cure the dielectric material layer after the step of performing the compression process;
removing the first substrate and the second substrate after the step of performing the curing process; and
forming at least a conductive through hole through the dielectric material layer to electrically connect the first patterned circuit layer to the second patterned circuit layer after the step of removing the first substrate and the second substrate.

2. The embedded chip package process of claim 1, wherein the dielectric material layer comprises a plastic film formed by plasticizing prepreg resin material.

3. The embedded chip package process of claim 2, wherein the plastic film includes glass epoxy based resin, bismaleimide-triazine (BT) resin or epoxy resin.

4. The embedded chip package process of claim 1, wherein the first patterned circuit layer has a first contact correspondingly disposed at one end of the conductive through hole and the second patterned circuit layer has a second contact correspondingly disposed at the other end of the conductive through hole, and the first contact is electrically connected to the second contact through the conductive through hole.

5. The embedded chip package process of claim 1, wherein the flip-chip bonding process of the first chip comprising to perform a solder ball connecting to the first bonding pad with soldering joint.

6. The embedded chip package process of claim 1, wherein the flip-chip bonding process of the first chip comprising to perform a gold stud bump connecting to the first bonding pad with soldering joint.

7. The embedded chip package process of claim 1, the second substrate further comprising a second chip, wherein the second chip is disposed on the second bonding pad and electrically connected to the second patterned circuit layer by performing a flip-chip bonding process.

8. The embedded chip package process of claim 7, wherein the flip-chip bonding process of the second chip comprising to perform a solder ball connecting to the first bonding pad with soldering joint.

9. The embedded chip package process of claim 7, wherein the flip-chip bonding process of the second chip comprising to perform a gold stud bump connecting to the first bonding pad with soldering joint.

10. The embedded chip package process of claim 1, further comprising a lamination or build-up process to connect the first and second conductive layers to other circuits and form an embedded chip package product after the step of forming the conductive through hole.

11. The embedded chip package process of claim 1, further comprising a step of forming a first dielectric layer and a second dielectric layer on the first and second patterned circuit layers respectively, and then forming at least a conductive hole through the first dielectric layer to connect with the first contact, wherein a solder ball is implanted on the conductive hole.

12. The embedded chip package process of claim 1, further comprising a step of filling a conductive material into the conductive through hole after the step of forming the conductive through hole.

* * * * *